US008253454B2

(12) United States Patent
Lin

(10) Patent No.: US 8,253,454 B2
(45) Date of Patent: Aug. 28, 2012

(54) PHASE LOCK LOOP WITH PHASE INTERPOLATION BY REFERENCE CLOCK AND METHOD FOR THE SAME

(75) Inventor: Chia-Liang Lin, Fremont, CA (US)

(73) Assignee: RealTek Semiconductor Corp., Hsinchu (TW)

( * ) Notice: Subject to any disclaimer, the term of this patent is extended or adjusted under 35 U.S.C. 154(b) by 741 days.

(21) Appl. No.: 12/263,456

(22) Filed: Nov. 1, 2008

(65) Prior Publication Data

US 2009/0163166 A1  Jun. 25, 2009

Related U.S. Application Data

(60) Provisional application No. 61/015,670, filed on Dec. 21, 2007.

(51) Int. Cl.
*H03L 7/06* (2006.01)
(52) U.S. Cl. ......... 327/147; 327/156; 327/162; 375/376
(58) Field of Classification Search .................. 327/141, 327/144–163; 331/1/A, 15–17; 375/373–376; 455/260, 265
See application file for complete search history.

(56) References Cited

U.S. PATENT DOCUMENTS

| 6,617,936 | B2 | 9/2003 | Dally et al. | |
|---|---|---|---|---|
| 6,683,506 | B2 | 1/2004 | Ye et al. | |
| 6,861,916 | B2 | 3/2005 | Dally et al. | |
| 7,046,058 | B1* | 5/2006 | Fang et al. | 327/158 |
| 2003/0058053 | A1* | 3/2003 | Jeon et al. | 331/17 |
| 2004/0158757 | A1* | 8/2004 | Lin | 713/401 |
| 2006/0055473 | A1 | 3/2006 | Takayama | |
| 2006/0188051 | A1* | 8/2006 | Donnelly et al. | 375/371 |
| 2007/0182470 | A1* | 8/2007 | Heyne | 327/158 |
| 2008/0068056 | A1* | 3/2008 | Poulton et al. | 327/156 |
| 2008/0260071 | A1* | 10/2008 | Sidiropoulos et al. | 375/334 |
| 2009/0045856 | A1* | 2/2009 | Spirkl et al. | 327/158 |

FOREIGN PATENT DOCUMENTS

CN  1741384 A  3/2006

OTHER PUBLICATIONS

Helal et al., "A low jitter 1.6GHz multiplying DLL utilizing a scrambling time-to-digital converter and digital correlation", 2007 Symposium on VLSI Circuits Digest of Technical Papers, 2007,pp. 166-167.
Ye et al., "A multiple-crystal interface PLL with VCO realignment to reduce phase noise",IEEE Journal of Solid State Circuits, vol. 37 No. 12, Dec. 2002, pp. 1795-1803.

* cited by examiner

*Primary Examiner* — Lincoln Donovan
*Assistant Examiner* — Brandon S Cole
(74) *Attorney, Agent, or Firm* — Thomas, Kayden, Horstemeyer & Risley, LLP

(57) ABSTRACT

The present invention relates to a PLL that utilizes a phase interpolation by a reference clock. The PLL includes a phase-interpolated controller for generating a phase-interpolation control signal; a phase/frequency detector for detecting a phase difference between a second reference clock and a feedback clock and outputting a phase error signal to represent the phase difference; a loop filter for filtering the phase error signal to generate a first control signal; a phase-interpolated oscillator for generating an output clock under a control by the phase-interpolation control signal and the first control signal; and a divide-by-N circuit for dividing down the output clock by a factor of N to generate the feedback clock, where N is an integer.

17 Claims, 4 Drawing Sheets

US 8,253,454 B2

PHASE LOCK LOOP WITH PHASE INTERPOLATION BY REFERENCE CLOCK AND METHOD FOR THE SAME

CROSS REFERENCE TO RELATED APPLICATIONS

This application claims the benefit of U.S. Provisional Application No. 61/015,670, filed on Dec. 21, 2007 and entitled "PHASE LOCK LOOP WITH PHASE INTERPOLATION BY REFERENCE CLOCK AND METHOD FOR THE SAME", the contents of which are incorporated herein by reference.

BACKGROUND OF THE INVENTION

1. Field of the Invention

The present invention relates to phase lock loop (PLL), in particular to PLL that employs phase interpolation by reference clock.

2. Description of Related Art

Phase lock loop (PLL) is an important circuit for numerous applications. FIG. 1 depicts a typical PLL 100 for receiving a reference clock and generating an output clock that is phase locked to the reference clock but has an N times higher frequency, where N is an integer. PLL 100 comprises: a phase/frequency detector (PFD) 110 for detecting a phase difference between the reference clock and a feedback clock and generating a phase error signal PE to represent the phase difference; a loop filter (LF) 120 for filtering the phase error signal PE to generate a voltage signal VCON; a voltage-controlled oscillator (VCO) 130 for generating the output clock under the control of the voltage signal VCON; and a divide-by-N circuit 150 for generating the feedback clock by dividing down the output clock by a factor of N. PLL 100 works in a feedback manner, adjusting the voltage signal VCON to force the phase of the feedback clock to align with the reference clock. In a steady state where the feedback clock is well aligned with the reference clock, the phase error signal PE is almost zero and the voltage signal VCON is almost constant.

VCO 130 is a ring oscillator comprising a voltage-controlled delay line (VCDL) 135 connected in a self-feedback topology. VCDL 135 has a delay controlled by the voltage signal VCON. As the delay changes, the oscillating frequency for VCO 130 also changes. In this manner, the oscillating frequency of VCO 130 is controlled by the voltage signal VCON. It has been well known that a ring oscillator is very noisy in general, due to the noise accumulation as the oscillating clock circulates through the VCDL 135 over and over. The noise in the ring oscillator degrades the quality of the output clock of the PLL.

What is needed is an apparatus and a method for reducing the noise of the ring oscillator of the PLL.

BRIEF SUMMARY OF THIS INVENTION

In an embodiment, a phase lock loop (PLL) with phase interpolation by a first reference clock is disclosed, the PLL comprising: a phase-interpolation controller for generating a phase-interpolation control signal from an input clock; a phase/frequency detector for detecting a phase difference between a second reference clock and a feedback clock and outputting a phase error signal to represent the phase difference; a loop filter for filtering the phase error signal to generate a first control signal; a phase-interpolated oscillator for generating an output clock under a phase interpolation controlled by the phase-interpolation signal and an oscillation condition controlled by the first control signal; and a divide-by-N circuit for dividing down the output clock by a factor of N to generate the feedback clock, where N is an integer.

In an embodiment, a method of phase locking is disclosed, the method comprising: generating a phase-interpolation control signal from an input clock; detecting a phase difference between a second reference clock and a feedback clock and outputting a phase error signal to represent the phase difference; filtering the phase error signal to generate a first control signal; generating an output clock under an oscillation condition controlled by the first control signal and a phase interpolation under a control by the phase-interpolation control signal; and dividing down the output clock by a factor of N to generate the feedback clock, where N is an integer.

DETAILED DESCRIPTION OF THIS INVENTION

While the specifications described several example embodiments of the invention considered best modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

As mentioned earlier, a ring oscillator is very noisy in general, due to the noise accumulation as the oscillating clock circulates through the delay line over and over. The noise in the ring oscillator degrades the quality of the PLL output clock. In comparison, a reference clock is usually a much less noisy clock. One may improve the quality of the PLL output clock by phase interpolating the oscillating clock using the reference clock. Also, care must be taken to make the phase interpolation seamless without introducing a glitch.

Figure 2A:
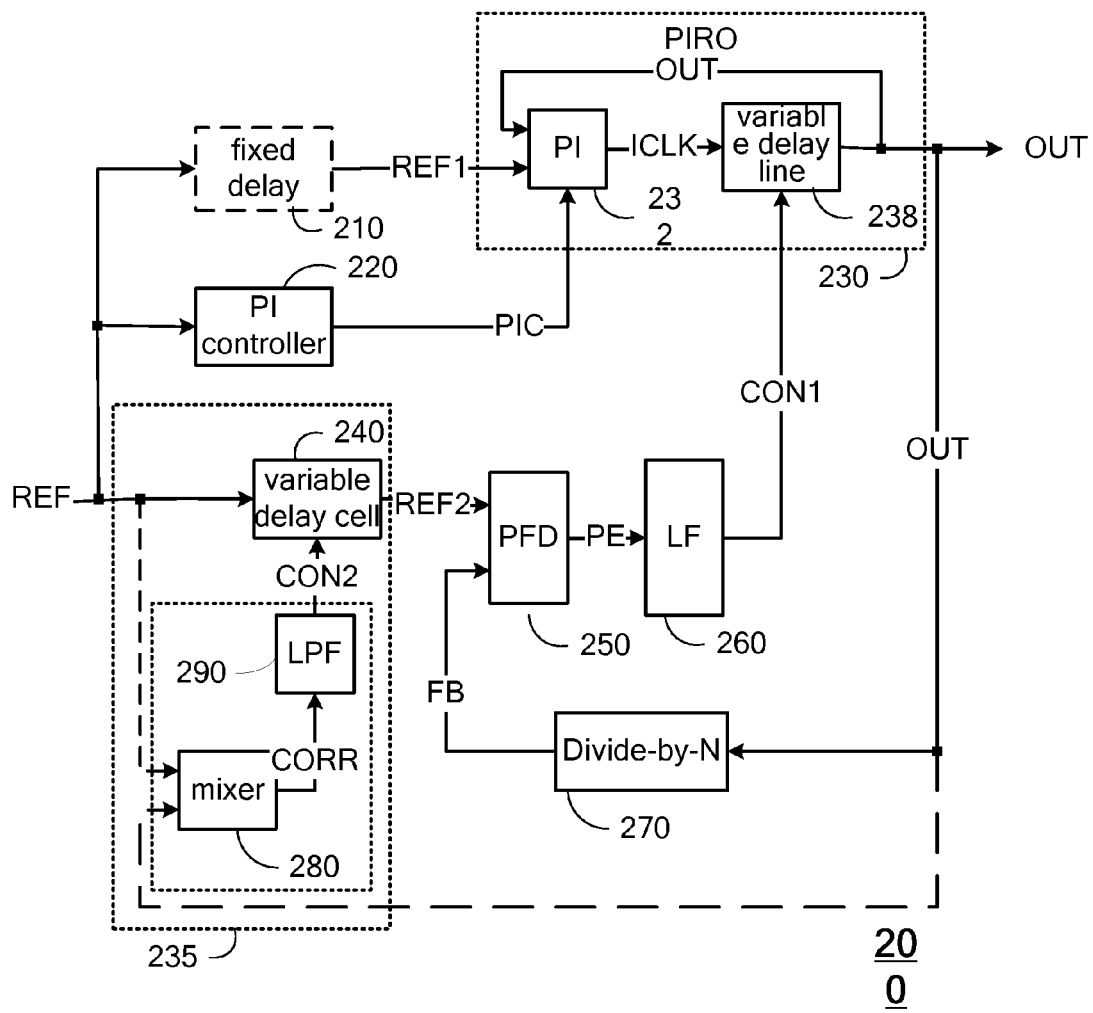
FIG. 2A shows a functional diagram of a PLL in accordance with the present invention.

FIG. 2A depicts a functional block diagram of an embodiment of a PLL 200 in accordance with the present invention. PLL 200 receives a reference clock REF and generates an output clock OUT that is phase locked to the reference clock but has an N times higher frequency, where N is an integer. PLL 200 comprises: a fixed delay circuit 210 for receiving the reference clock REF and outputting a first delayed reference clock REF1 that has a fixed delay relative the reference clock REF; a phase-interpolated ring oscillator (PIRO) 230 for receiving the first delayed reference clock REF1 and generating the output clock OUT under a control by a phase-interpolation control signal PIC and a first control signal CON1; a phase-interpolation (PI) controller 220 for receiving the reference clock REF and generating the phase-interpolation control signal PIC; a divide-by-N circuit 270 for generating a feedback clock FB by dividing down the output clock OUT by the factor N; a variable delay module 235 for outputting a second delayed reference clock REF2 that has a variable delay relative the reference clock REF, where the variable delay is controlled in a closed-loop manner by a second control signal CON2; a phase/frequency detector (PFD) 250 for receiving the second delayed reference clock REF2 and the feedback clock FB and outputting a phase error signal PE representing a phase difference between the second delayed reference clock REF2 and the feedback clock FB; and a loop filter (LF) 260 for filtering the phase error signal PE to generate the first control signal CON1 to control the phase-interpolating ring oscillator (PIRO) 230. In a steady state, the mean value of the phase error signal PE is zero, and the first control signal CON1 settles into a proper value so that the oscillating frequency of the phase-interpolating ring oscillator 230 is N times higher than that of the reference clock REF. Also, the second control signal CON2 settles into a proper value so that the phase of the output clock OUT is properly established to make a seamless phase-interpolation in the phase-interpolated ring oscillator (PIRO) 230. In an embodiment, the fixed delay circuit 210 can be omitted.

In an embodiment, the variable delay module 235 comprises: a variable delay cell 240 for receiving the reference clock REF and outputting a second delayed reference clock REF2 that has a variable delay relative the reference clock REF, where the variable delay is controlled by the second control signal CON2; and a delay controller 275 for generating the second control signal CON2. In a preferred embodiment, the delay controller 275 further comprises: a mixer 280 for performing a frequency mixing between the reference clock REF and the output clock OUT and generating a correlation signal CORR quantifying the correlation between the reference clock REF and the output clock OUT; and a low-pass filter (LPF) 290 for receiving the correlation signal CORR and generating the second control signal CON2.

Still refer to FIG. 2A. An embodiment of the phase-interpolated ring oscillator (PIRO) 230 further comprises a phase interpolator (PI) 232 for receiving the output clock OUT and the first delayed reference clock REF1 and outputting an interpolated clock ICLK under a control by the phase-interpolation control signal PIC, and a variable delay line 238 for receiving the interpolated clock ICLK and outputting the output clock OUT under the control of the first control signal CON1. The phase of ICLK is interpolated between the phase of the output clock OUT and the phase of the first delayed reference clock REF1. Mathematically, one has the following expression:

$$(\text{Phase of ICLK}) = (\text{Phase of REF1}) \times \beta + (\text{Phase of OUT}) \times (1-\beta) + \delta,$$

where $\delta$ is a constant offset due to circuit delay, and $\beta$ is an interpolation factor (which is between 0 and 1, inclusively) controlled by the phase-interpolation control signal PIC, which is a logical signal. In particular, $\beta$ is zero unless PIC is asserted. By timely asserted PIC, one performs a phase interpolation on the oscillating clock of PIRO 230 using the supposedly less noisy first delayed reference clock REF1.

Figure 2B:
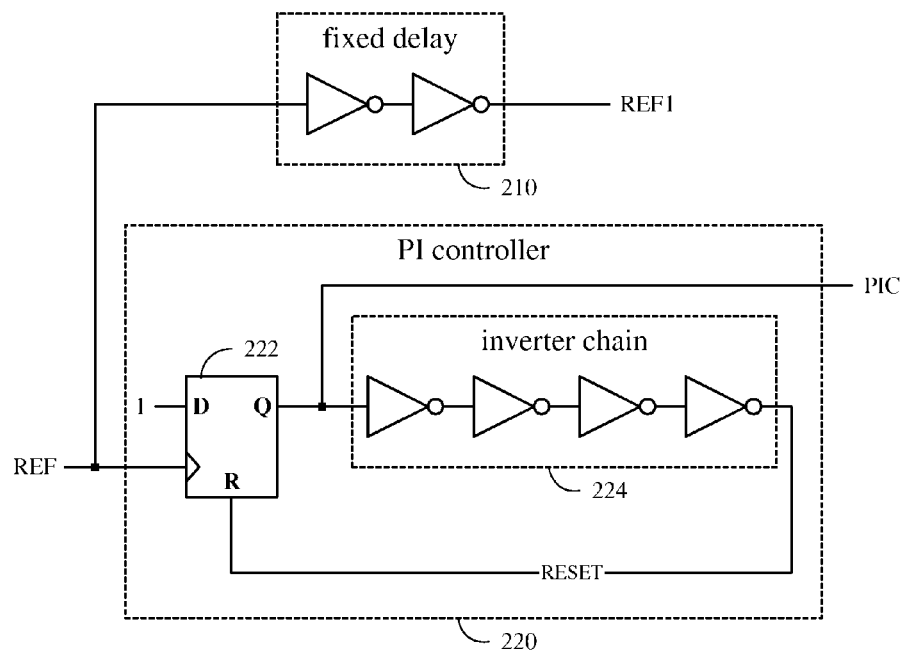
FIG. 2B shows an embodiment of a fixed delay circuit and a phase-interpolation controller for the PLL of FIG. 2A.
Figure 2C:
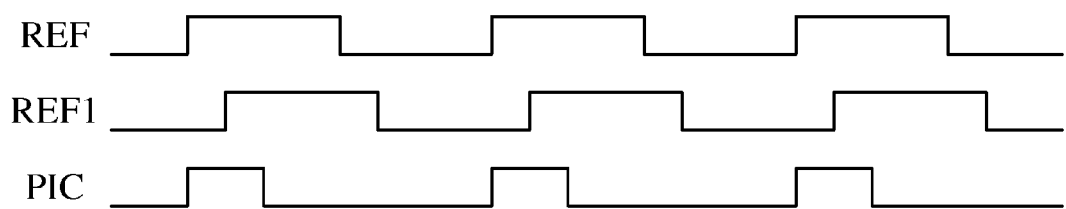
FIG. 2C shows a timing diagram for the fixed delay circuit and the phase-interpolation controller of FIG. 2B.

FIG. 2B depicts an exemplary embodiment for the fixed delay circuit 210 and the PI controller 220. The fixed delay circuit 210 receives the reference clock REF and outputs the first delayed reference clock REF1 using two cascaded inverters. The PI controller 220 comprises a data flip-flop (DFF) 222 and an inverter chain 224 comprising four cascaded inverters. DFF 222 receives a constant logic 1 and outputs the phase-interpolation control signal PIC under a trigger of the reference clock REF. The inverter chain 224 receives the phase-interpolation control signal PIC and outputs a reset signal RESET to reset DFF 222. FIG. 2C depicts an illustrative timing diagram for the reference clock REF, the first delayed reference clock REF1, and the phase-interpolation control signal PIC. Note that the phase-interpolation control signal PIC is asserted shortly before a rising edge of the first delayed reference clock and de-asserted shortly after the rising edge of the first delayed reference clock. As mentioned earlier, the phase interpolation by the first delayed reference clock REF1 in the phase-interpolated ring oscillator (RIPO) 230 is enabled only when the phase interpolation control signal PIC is asserted. Therefore, the phase-interpolation takes place around the rising edge of the first delayed reference clock REF1.

Figure 2D:
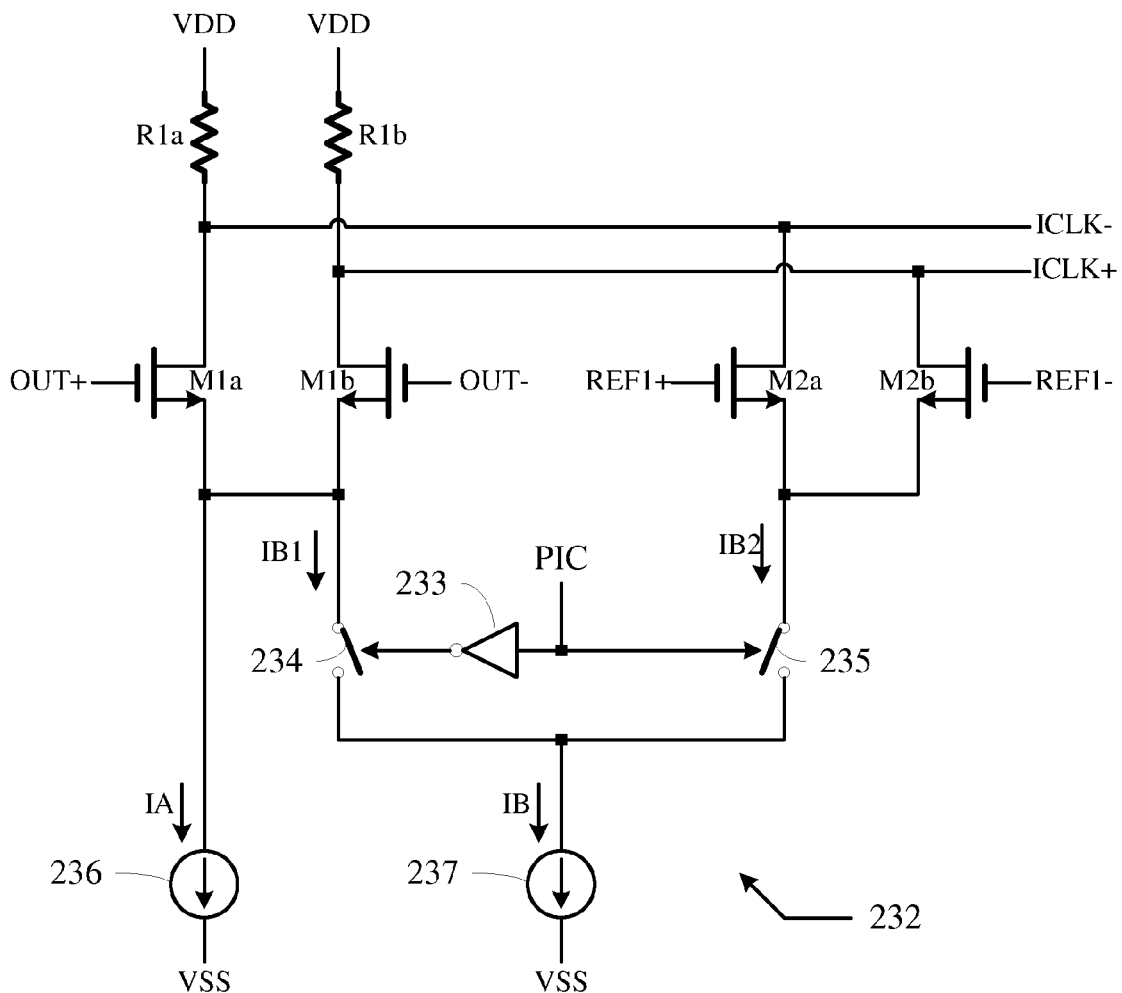
FIG. 2D shows an embodiment of a phase interpolator.

FIG. 2D depicts an exemplary embodiment of the phase interpolator (PI) 232. In this embodiment, a fully differential circuit topology is employed, where a signal is embodied by a positive end and a negative end. For instance, the output clock OUT is embodied by a positive end OUT+ and a negative end OUT−. Phase interpolator (PI) 232 includes: a first differential pair M1a-M1b for receiving the output clock OUT+/−, and a second differential pair M2a-M2b for receiving the first delayed reference clock REF1+/−. The two differential pairs M1a-M1b and M2a-M2b share a common load circuit, i.e. a resistor pair R1a-R1b. Here, VDD denotes a first fixed-potential circuit node (which is usually connected to a power supply). Phase interpolator 232 further includes: a first current source 236 for providing a first current IA, and a second current source 237 for providing a second current IB. Here, VSS denotes a second fixed-potential circuit node (which is usually grounded). The second current IB is further steered into two currents IB1 and IB2 using a switch pair 234-235. When the phase-interpolation control signal PIC is asserted, switch 235 is turned on and switch 234 is turned off, and consequently the second current IB is completely steered into current IB2. When the phase-interpolation control signal PIC is not asserted, switch 234 is turned on and switch 235 is turned off, and consequently the second current IB is completely steered into current IB1. An inverter 233 is used to provide a logical inversion on the phase-interpolation control signal PIC to control switch 234. Currents IA and IB1 are provided to bias the first differential pair M1a-M1b, and current IB2 is provided to bias the second differential pair M2a-M2b. When PIC is not asserted, the first differential pair is biased by current IA plus current IB and the second differential pair receives no bias current. As a result, the phase of the interpolated clock ICLK+/− is equal to the phase of the output clock OUT+/− plus a constant offset (i.e., $\delta$) due to circuit delay. When PIC is asserted, the first differential pair is biased by current IA and the second differential pair is biased by current IB. As a result, the phase of the interpolated clock ICLK+/− is a constant offset (i.e., $\delta$) plus a phase interpolated from the phase of the output clock OUT+/− and the phase of the first delayed reference clock REF1+/− with an interpolation factor (i.e. $\beta$) determined by a relative magnitude between current IA and current IB. In a first extreme case where IA is zero, the interpolation factor is 1. In this case, the feedback path in the phase-interpolated ring oscillator (PIRO) 230 is incidentally broken (when PIC is asserted) and the phase of the interpolated clock ICLK+/− is equal to the phase of the output clock REF1+/− plus a constant offset (i.e., $\delta$) due to circuit delay. In a second extreme case where IB is zero, the interpolation factor is 0 and there is no phase interpolation by the first delayed reference clock REF1+/−. In this case, the phase of the interpolated clock ICLK+/− is equal to the phase of output clock OUT+/− plus a constant offset (i.e., $\delta$) due to circuit delay, and the phase-interpolated ring oscillator (PIRO) 230 is functionally equivalent to a prior art ring oscillator. When the interpolation factor is nonzero, the supposedly less noisy first delayed reference clock REF1 is injected into PIRO 230 and thus reduces the noise level of the oscillating clock in the ring oscillator.

Still refer to FIG. 2D. Current sources (236, 237) can be embodied by a NMOS (N-channel metal-oxide semiconductor) field effect transistor. Those of ordinary skill in the art know how to use a MOS field-effect transistor to implement a current source and therefore the detail is not given here. In an embodiment, the output level for either one of the two current sources (236, 237) can be dynamically adjusted. It this manner, the interpolation factor ($\beta$) for the phase-interpolated ring oscillator (PIRO) 230 of FIG. 2A can be dynamically adjusted. In an embodiment, the interpolation factor ($\beta$) is set to zero initially and then set to nonzero only after the first control signal CON1 reaches a stabilized level.

Now refer back to FIG. 2A. Variable delay line 238 can be embodied by an inverter chain receiving a variable bias current, which determines the circuit delay of the inverter chain. In this case, the first control signal CON1 determines the variable bias current and consequently determines the circuit delay. Variable delay line 238 can also be embodied by many alternative circuits known to those of ordinary skill in the art.

Still refer to FIG. 2A. The embodiments of phase/frequency detector (PFD) 250, loop filter (LF) 260, and divide-by-N circuit 270 are all well known in prior art and well understood to those of ordinary skill in the art and thus are not described in detail here. In a steady state, the first control signal CON1 is established in a closed-loop manner to control phase-interpolated ring oscillator (PIRO) 230 such as to force the phase of the feedback clock FB to align with the phase of the second delayed reference clock REF2. Loop filter 260 comprises a few circuit elements, e.g. resistors and capacitors. In an embodiment, the circuit elements for the loop filter 260 are dynamically adjusted in accordance with the dynamical adjustment of the phase-interpolation factor ($\beta$) for the phase-interpolating ring oscillator (PIRO) 230.

Although the purpose of the phase interpolation in the phase-interpolated ring oscillator (PIRO) 230 is to reduce to noise level of the oscillating clock in the ring oscillator by timely injecting a supposedly less noisy first delayed reference clock REF1, one would like the mean phase of the output clock OUT to align with the mean phase of the first delayed reference clock REF1. Otherwise, the noise level is reduced at the cost of an abrupt phase change upon phase interpolation, which occurs around a rising edge of the first delayed reference clock REF1. When this abrupt phase change takes place at every rising edge of the first delayed reference clock REF1, a spurious tone known as "reference spur" appears in the output clock OUT. This abrupt phase change can be alleviated by properly establishing the second control signal CON2 to control the variable delay cell 240 in a closed-loop manner using the feedback loop including mixer 280 and low-pass filter (LPF) 290. The mixer 280 estimates the amplitude of the spurious tone by performing a frequency-mixing between the reference clock REF and the output clock OUT and represents the amplitude by the correlation signal CORR. The correlation signal CORR is filtered by LPF 290, resulting in the second control signal CON2 to control the variable delay cell 240. The delay of the variable delay cell 240 is thus adjusted to minimize the spurious tone. In an alternative embodiment (not shown in the figure), the mixer performs a frequency mixing between the first delayed reference clock REF1 (instead of REF) and the output clock OUT. In a yet alternative embodiment (not shown in the figure), the mixer performs a frequency mixing between the second delayed reference clock REF2 (instead of REF or REF1) and the output clock OUT.

In summary, there are two control loops in PLL 200. The first control loop is settled when the mean value of the phase error signal PE is zero; when this happens, the first control signal CON1 is properly established so that the feedback clock FB aligns well with the second delayed reference clock REF2. The second control loop is settled when the mean value of the correlation signal CORR is zero; when this happens, the second control signal CON2 is properly established so that the output clock OUT aligns well with the first delayed reference clock REF1 and therefore the phase-interpolation is performed seamlessly and there is very low reference spur in the output clock OUT.

Figure 1:
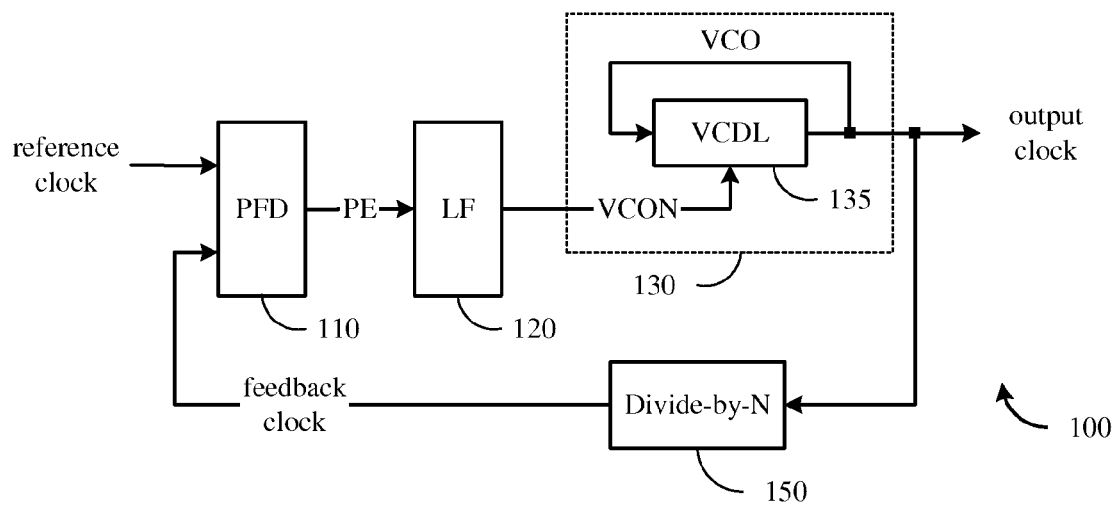
FIG. 1 shows a functional block diagram of a prior art phase lock loop (PLL).

In the conventional PLL 100 of FIG. 1, the mean frequency of the output clock cannot be exactly N times higher than the mean frequency of the reference clock unless the mean value of the control voltage VCON is accurately established. Thanks to the phase interpolation by a reference clock, the mean frequency of the output clock OUT of PLL 200 of FIG. 2A can still be exactly N times higher than the mean frequency of the reference clock REF even if the mean value of the control signal CON1 is not accurately established. This is because the phase error (due to the inaccuracy in the mean value of the control signal CON1) will be corrected upon the phase interpolation by the reference clock and therefore the mean frequency of the output clock OUT is thus still correct, as long as the mean value of the control signal CON1 is not too much off. This allows the first control loop to be occasionally deactivated without the risk of loss of phase/frequency lock of the output clock. In an embodiment, the first control loop is deactivated intermittently. When deactivated, the first control loop freezes the first control signal CON1, or equivalently, forcefully sets the phase error signal PE to zero. The second control loop can also be occasionally deactivated. When deactivated, the second control loop freezes the second control signal CON2, or equivalently, forcefully sets the correlation signal CORR to zero. In an embodiment, the second control loop is activated only after the first control loop settles. This reduces the mutual interference between the two control loops.

Both mixer (280) and low-pass filter (290) are well known to those of ordinary skill in the art and therefore their detailed implementations are not described here. Variable-delay cell 240 can be embodied by an inverter chain biased by a variable current controlled by the second control signal CON2, which controls the variable current and thus determines the delay of the variable-delay cell 240.

Both of the first control signal CON1 and the second control signal CON2 can be embodied in various forms, including: continuous-time voltage signal, and discrete-time digital signal. When the first control signal CON1 is embodied by a discrete-time digital signal, phase/frequency detector (PFD) 250 can be embodied by time-to-digital converter (TDC), which is well known in prior art and thus not described in detail here. In this case, loop filter (LF) 260 is a digital circuit comprising various DSP (digital signal processing) units, e.g. data flip-flop, adders, multipliers, and so on. When the second control signal CON2 is embodied by a discrete-time digital signal, LPF 290 must include an analog-to-digital converter (ADC), which is well known in prior art and thus not described in detail here, followed by various DSP units, data flip-flop, adders, multipliers, and so on.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase lock loop (PLL) comprising:
 a phase-interpolation controller for generating a phase-interpolation control signal from an input clock;

a phase/frequency detector for detecting a phase difference between a second reference clock and a feedback clock and outputting a phase error signal to represent the phase difference;

a loop filter for filtering the phase error signal to generate a first control signal;

a phase-interpolated oscillator for generating an output clock under a phase interpolation by a first reference clock controlled by the phase-interpolation control signal and an oscillation condition controlled by the first control signal;

a divide-by-N circuit for dividing down the output clock by a factor of N to generate the feedback clock, where N is an integer; and a variable delay module, coupled to the phase/frequency detector, for delaying the input clock by an amount controlled by a second control signal to generate the second reference clock.

2. The PLL of claim 1, the variable delay module further comprising:

a delay controller, for receiving the input clock and the output clock and thereby generating the second control signal; and a variable delay cell, coupled to the phase/frequency detector and the delay controller, for delaying the input clock by the amount controlled by the second control signal to generate the second reference clock.

3. The PLL of claim 2, the delay controller comprising:

a mixer for performing a frequency mixing between the input clock and the output clock to generate a correlation signal; and a low-pass filter for filtering the correlation signal to generate the second control signal.

4. The PLL of claim 1, wherein at least one of the first reference clock and the second reference is generated in accordance with the input signal.

5. A phase lock loop (PLL) comprising:

a phase-interpolation controller for generating a phase-interpolation control signal from an input clock;

a phase/frequency detector for detecting a phase difference between a second reference clock and a feedback clock and outputting a phase error signal to represent the phase difference;

a loop filter for filtering the phase error signal to generate a first control signal;

a phase-interpolated oscillator for generating an output clock under a phase interpolation by a first reference clock controlled by the phase-interpolation control signal and an oscillation condition controlled by the first control signal;

a divide-by-N circuit for dividing down the output clock by a factor of N to generate the feedback clock, where N is an integer; and a fixed delay circuit, coupled to the phase-interpolated oscillator, for delaying the input clock to generate the first reference clock to the phase-interpolated oscillator.

6. The PLL of claim 5, the phase-interpolated oscillator comprising:

a phase interpolator for performing a phase interpolation between the output clock and the first reference clock with an interpolation factor controlled by the phase-interpolation control signal to generate an interpolated clock; and a variable delay line, coupled to the phase interpolator and the loop filter, for delaying the interpolated clock according to the first control signal to generate the output clock.

7. The PLL of claim 6, the phase interpolator comprising:

at least a first transistor for receiving the output clock;

at least a second transistor for receiving the first reference clock;

a common load circuit coupled to said first transistor and said second transistor;

a biasing circuit, for establishing a first biasing condition for said first transistor and a second biasing condition for said second transition in accordance with the phase-interpolation control signal.

8. The PLL of claim 7, wherein said first transistor is a part of a first differential pair and said second transistor is a part of a second differential pair.

9. A phase lock loop (PLL) comprising:

a phase-interpolation controller for generating a phase-interpolation control signal from an input clock;

a phase/frequency detector for detecting a phase difference between a second reference clock and a feedback clock and outputting a phase error signal to represent the phase difference;

a loop filter for filtering the phase error signal to generate a first control signal;

a phase-interpolated oscillator for generating an output clock under a phase interpolation by a first reference clock controlled by the phase-interpolation control signal and an oscillation condition controlled by the first control signal; and a divide-by-N circuit for dividing down the output clock by a factor of N to generate the feedback clock, where N is an integer;

wherein the phase-interpolation controller comprising:

a flip-flop for receiving the input clock and outputting the phase-interpolation control signal; and an inverter chain for receiving the phase-interpolation control signal and outputting a reset signal to reset the flip-flop.

10. A method of phase locking comprising:

generating a phase-interpolation control signal;

detecting a phase difference between a second reference clock and a feedback clock and outputting a phase error signal to represent the phase difference;

filtering the phase error signal to generate a first control signal;

generating an output clock under a phase interpolation controlled by the phase-interpolation control signal and an oscillation condition controlled by the first control signal;

dividing down the output clock by a factor of N to generate the feedback clock, where N is an integer; and delaying an input clock by a controlled amount by a second control signal to generate the second reference clock.

11. The method of claim 10, further comprising:

generating the second control signal according to a relation between the input clock and the output clock.

12. The method of claim 11, the step of generating the second control signal further comprising:

performing a frequency mixing between the input clock and the output clock to generate a correlation signal; and filtering the correlation signal to generate the second control signal.

13. A method of phase locking comprising:

generating a phase-interpolation control signal;

detecting a phase difference between a second reference clock and a feedback clock and outputting a phase error signal to represent the phase difference;

filtering the phase error signal to generate a first control signal;

generating an output clock under a phase interpolation controlled by the phase-interpolation control signal and an oscillation condition controlled by the first control signal;

dividing down the output clock by a factor of N to generate the feedback clock, where N is an integer; and delaying the input clock to generate a first reference clock.

14. The method of claim 13, further comprising:

performing a phase interpolation between the output clock and the first reference clock with an interpolation factor controlled by the phase-interpolation control signal to generate an interpolated clock; and delaying the interpolated clock according to the first control signal to generate the output clock.

15. The method of claim 10, the step of generating the phase-interpolation control signal comprising:

generating the phase-interpolation control signal according to the input clock.

16. The method of claim 15, the step of generating the phase-interpolation control signal comprising:

generating a reset signal according to the phase-interpolation control signal to reset the step of generating the phase-interpolation control signal.

17. The method of claim 10, wherein the phase-interpolation control signal and at least one of the first reference clock and the second reference are generated in accordance with the input signal.

* * * * *